April 17, 1956 | J. O. PREISIG | 2,742,615

FREQUENCY SELECTIVE CIRCUITS

Filed Dec. 30, 1952

INVENTOR.
JOSEPH O. PREISIG

BY [signature]

ATTORNEY

United States Patent Office 2,742,615

Patented Apr. 17, 1956

2,742,615

FREQUENCY SELECTIVE CIRCUITS

Joseph O. Preisig, Mercerville, N. J., assignor to Radio Corporation of America, a corporation of Delaware Application December 30, 1952, Serial No. 328,691

3 Claims. (Cl. 333—72)

The present invention relates to frequency selective circuits for passing a discrete band of frequencies, and more particularly to crystal filter circuits for passing a very narrow band of frequencies surrounding a desired frequency.

The properties of piezoelectric quartz crystals have long been recognized as suitable for use in selective filters for passing waves of a discrete band of frequencies. The crystals are frequently utilized in coupling two parallel resonant circuits between tuned amplifier stages.

The properties of a piezoelectric quartz crystal may be represented by an equivalent circuit in which a series resonant branch represents the properties of the crystal itself while a capacitive branch represents the effects of the crystal holder. The action of the parallel resonant circuits in an ordinary crystal filter circuit, however, have been found to damp or to load the action of the crystal to an extent that the maximum theoretical efficiencies or "Q" of the series resonant action of the crystal is not realized.

In a proposed system of color television transmission, a color synchronizing signal is transmitted for establishing a wave of fixed frequency and phase at the color television receiver for purposes of demodulating a phase modulated subcarrier in order to derive color signal information therefrom. This color synchronizing signal, commonly known as "burst," is transmitted immediately following the conventional horizontal synchronizing pulse component, thus being positioned on that portion of the blanking pedestal commonly known as the "back porch." One method of establishing the reference frequency wave at a color television receiver contemplates gating out the portion of the composite television signal containing the color synchronizing signal and applying the color synchronizing signal across a highly selective filter circuit. If the filter circuit is resonant, a damped train of waves of the frequency and phase of the color synchronizing signal is provided which may be amplified for use as the reference frequency wave for purposes of demodulating a color subcarrier signal. One such system is well shown and described in the copending United States patent application of Jack Avins and Marvin Kronenberg, entitled "Color Synchronization," Serial No. 238,162, filed July 23, 1951, now Patent No. 2,712,568, issued July 5, 1955. It will be appreciated that the resonant filter circuit used in such a system should have as high an efficiency or "Q" as possible.

It is an object of this invention to provide a crystal filter circuit having an improved efficiency and improved characteristics for passing waves of an extremely narrow discrete band of frequencies.

It is another object of the present invention to provide a filter circuit for substantially realizing the theoretical efficiency of a piezoelectric quartz crystal for passing waves of a discrete band of frequencies.

According to this invention, a narrow bandwidth high efficiency crystal filter circuit is provided by coupling a piezoelectric quartz crystal between two series resonant circuits and energizing the filter circuit across the inductive element of one of the series resonant circuits.

Other and incidental objects of this invention will become apparent upon a reading of the following specification and an inspection of the drawings in which.

Figure 1:
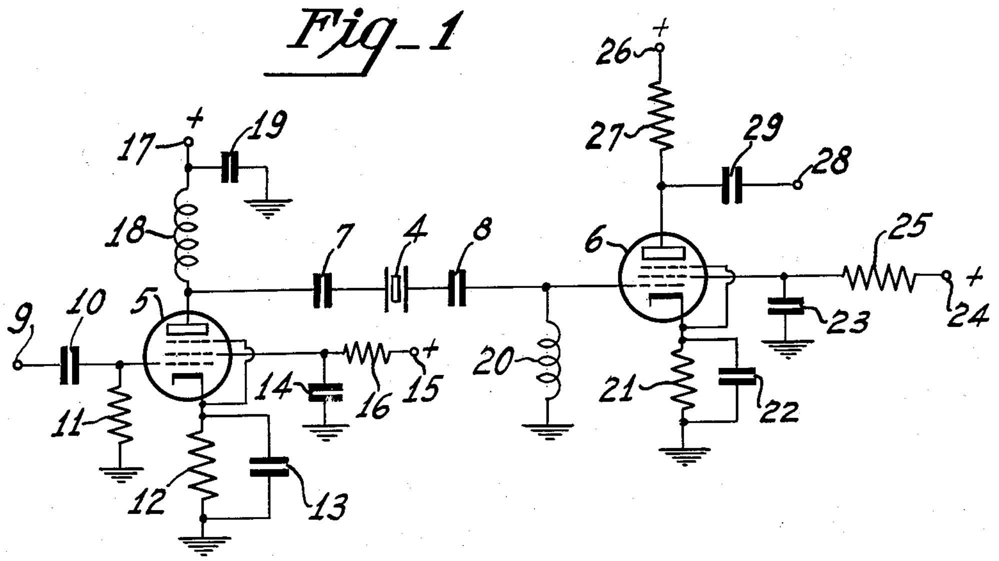
Figure 1 is a schematic circuit diagram including an illustrative embodiment of the present invention.

Turning now in detail to Figure 1, one side of a piezoelectric crystal 4 is coupled to the anode of an amplifying electron tube 5 by a capacitance 7, and the other side of the piezoelectric crystal 4 is coupled to the control electrode of an amplifying electron tube 6 by means of a capacitance 8. Input signals applied to the input terminal 9 are coupled to the control electrode of the electron tube 5 by a capacitance 10, and a conventional grid leak resistance 11 is connected between the control electrode of the amplifying electron tube 5 and ground reference potential. The electron tube 5 may secure a suitable biasing potential by means of a resistance 12 and a capacitance 13 connected between the cathode of the electron tube 5 and ground reference potential. In a conventional manner, the screen grid of the electron tube 5 may be maintained at A. C. ground reference potential by means of the capacitance 14, and a suitable operating potential may be applied thereto by means of a terminal 15 and a screen resistance 16. To minimize interelectrode capacitance effects, the suppressor grid of the electron tube 5 may be connected to the cathode as shown. Suitable positive anode potential may be applied to the electron tube 5 by means of a terminal 17 through an inductance 18. The end of the inductance 18 connected to terminal 17 is maintained at A. C. ground reference potential by means of a decoupling capacitance 19. The values of the capacitance 7 and the inductance 18 are chosen so that they form a series resonant circuit at the desired frequency to be passed by the filter. This series resonant frequency should be equal to the series resonant frequency of the piezoelectric quartz crystal 4. Since the series resonant circuit comprising capacitance 7 and inductance 18 forms a low impedance to the desired signal frequency, the side of the piezoelectric quartz crystal 4 connected to the capacitance 7 is maintained at substantially A. C. ground reference potential at that frequency. Considering the load impedance of the amplifying electron tube 5, it will be appreciated that a load impedance is presented which is relatively high since the anode of the electron tube 5 sees the circuit as a parallel resonant circuit at the signal frequency. Thus, a high order of amplification may be obtained.

The control electrode of the amplifying electron tube 6 is connected to ground reference potential through an inductance 20. The value of the inductance 20 and the value of the capacitance 8 should be chosen so as to form another series resonant circuit having a series resonant frequency equal to the series resonant frequency of the piezoelectric quartz crystal 4. This will present a relatively low impedance path between the side of the piezoelectric quartz crystal 4 connected to the capacitance 8 and A. C. ground reference potential at the desired signal frequency. However, considering the impedance presented to the control electrode of the amplifying electron tube 6, it will be seen that a relatively high impedance is provided since the capacitance 8 and the inductance 20 act like a parallel resonant circuit with respect thereto. Since both sides of the piezoelectric quartz crystal 4 are maintained at A. C. ground reference potential, and since a low impedance path is provided from each side to A. C. ground reference potential, the damping effect of the circuitry on the piezoelectric quartz crystal 4 will be negligible. Thus it is possible to realize a highly efficient operation of the crystal 4 in its series resonant mode. This results in a very narrow discrete band of frequencies being passed by the piezoelectric quartz crystal 4, while other frequencies are attenuated. The narrow band of frequencies passed by the piezoelectric quartz crystal 4 may be amplified by a conventional amplifying electron tube 6. The amplifying electron tube 6 is self biased by means of a resistance 21 and a capacitance 22 connected in parallel between the cathode and ground reference potential. The screen grid of the electron tube 6 is maintained at A. C. ground reference potential by means of a screen bypass capacitance 23, and a suitable positive operating potential may be applied to the screen by means of a terminal 24 and a screen resistance 25. To minimize interelectrode capacitance effects, the suppressor electrode is connected to the cathode of the electron tube 6 as shown. Suitable positive anode potential may be applied to the anode of the electron tube 6 by means of a terminal 26 and a load resistance 27, and the amplified signal appearing at the anode of the electron tube 6 may be coupled to an output terminal 28 by means of a capacitance 29.

Although specific circuitry has been shown for the amplifying electron tubes 5 and 6, it will be appreciated that the principles of the crystal filter circuit of this invention are not limited thereto. Any suitable source of signals might be applied to the junction between the inductance 18 and the capacitance 7, and any utilization device or amplifier might be coupled to the junction between the capacitance 8 and the inductance 20.

Figure 2:
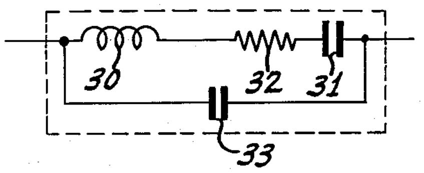
Figure 2 is an equivalent circuit diagram of a piezoelectric quartz crystal and its associated holder.

Figure 2 shows an equivalent circuit of a piezoelectric quartz crystal and its associated holder. The series resonant branch comprises an inductance 30, a capacitance 31, and an internal resistance 32. This resistance 32 limits the maximum theoretical efficiency or "Q" of the series resonant branch. Information on the grinding and preparation of piezoelectric quartz crystals to obtain a desired series resonant frequency may be found in the "Radio Engineers Handbook" by F. Terman, first edition, at page 488. The capacitance 33 represents the capacitance introduced by the associated circuits and holder for making electrical connection to the piezoelectric quartz crystal. Where the bypassing action of the capacitance 33 around the series resonant branch is objectionable, neutralizing means for minimizing its effect may be employed. An illustrative embodiment including neutralization means for neutralizing the effects of such capacitance is shown in the embodiment of Figure 3.

Figure 3:
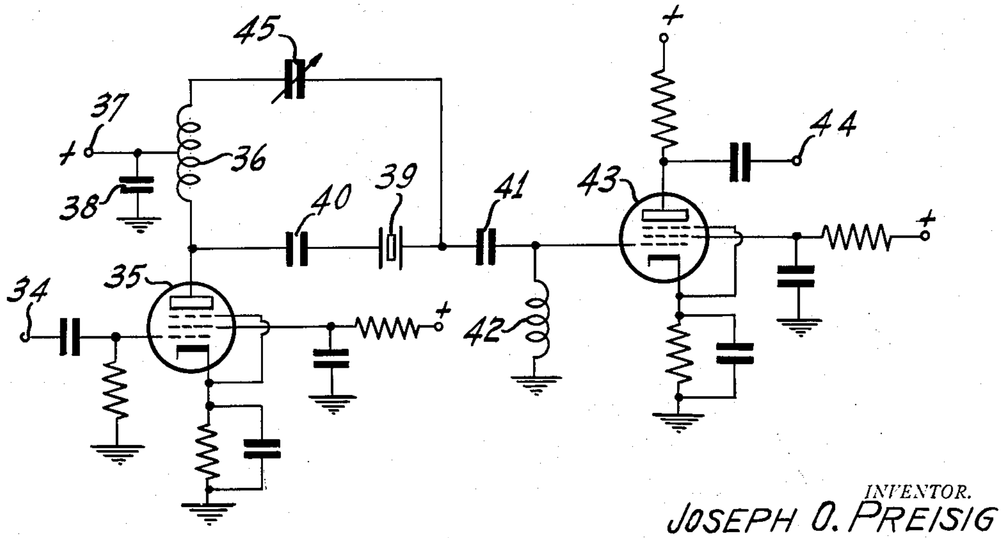
Figure 3 is a schematic circuit diagram of another illustrative embodiment of the present invention.

Signals applied to an input terminal 34 of Figure 3 are amplified by a conventional amplifying electron tube 35 working into an inductive load consisting of the lower half of the tapped inductance 36. Since the other circuitry associated with the amplifying electron tube 35 is the same as that shown and described with reference to the amplifying electron tube 5 of Figure 1, no further discussion of the circuitry will be given here. Suitable anode potential for the electron tube 35 may be applied thereto by means of a terminal 37 which is connected to a suitable tap on the inductance 36. The tap of the inductance 36 may be maintained at A. C. ground reference potential by means of a bypass capacitance 38. The piezoelectric quartz crystal 39 is coupled to the anode of the electron tube 35 by means of a capacitance 40. The inductance 36 and the capacitance 40 should have suitable values so that the portion of the inductance 36 between the tap and the anode of electron tube 35 and the capacitance 40 form a series resonant circuit at the desired signal frequency. A series resonant circuit comprising a capacitance 41 and an inductance 42 is connected between the other side of the piezoelectric quartz crystal 39 and ground reference potential. Thus, by means of the capacitance 40, one part of the inductance 36, the capacitance 41, and the inductance 42 both sides of piezoelectric quartz crystal 39 are coupled together by means of a low impedance path at the signal frequency. This allows the piezoelectric quartz crystal 39 to operate efficiently in an undamped condition as was noted with reference to the embodiment of Figure 1. The signal appearing between the capacitance 41 and the inductance 42 may be amplified by a conventional amplifying electron tube 43 thereby appearing at the output terminal 44. Since the circuitry associated with the electron tube 43 is the same as that shown with reference to the electron tube 6 of the embodiment of Figure 1, no further discussion will be given here.

A neutralization capacitance 45 couples a small amount of energy from the side of the piezoelectric quartz crystal 39 which is coupled to the control electrode of the electron tube 43 to the end of the inductance 36 opposite to that connected to the amplifying electron tube 35. Due to the fact that the tap of the inductance 36 is maintained at A. C. ground reference potential, it will be appreciated that opposite ends of the inductance 36 will have an 180° out of phase relationship one to the other. By coupling a small amount of out of phase energy from the 180° side of the inductance 36 to the output side of the crystal 39, the effect of the holder capacitance 33 may be neutralized. The capacitance 45 has been shown to be variable so that a suitable adjustment can be made for proper neutralization. In like manner, as was noted with respect to Figure 1, the embodiment of Figure 3 may be used to advantage as a filter circuit where it is desired to provide a band-pass of extremely narrow frequencies.

The principles of the invention might well be applied to color television systems wherein it is desired to separate the color synchronizing signal from the composite television signal wave by means of a filter circuit having a highly efficient narrow pass band. However, the principles of the present invention are not limited to color television systems; they might well be applied to any signal transfer circuit where efficient narrow band-pass characteristics are desired.

What is claimed is:

1. A crystal filter circuit comprising, a piezoelectric quartz crystal having a desired series resonant frequency, a first and second series resonant circuit each comprising a first and second reactance connected serially, signal input means coupled across said first reactance of said first series resonant circuit, said first and second series resonant circuit each having a series resonant frequency equal to the series resonant frequency of said piezoelectric quartz crystal, means coupling said piezoelectric quartz crystal between said second reactance of said first series resonant circuit and said first reactance of second series resonant circuit, and signal output means coupled across said second reactance of said second series resonant circuit.

2. A crystal filter circuit including the combination of, a piezoelectric quartz crystal having a desired series resonant frequency, a first series resonant circuit having series resonance at a frequency equal to the desired series resonant frequency of said piezoelectric quartz crystal, said first series resonant circuit comprising an inductance and a capacitance, a signal input circuit connected across said first resonant circuit inductance, a second resonant circuit having resonant frequency equal to the desired resonant frequency of said piezoelectric quartz crystal, said second series resonant circuit comprising a capacitance and an inductance, a signal output circuit connected across said second series resonant circuit inductance, and means coupling said piezoelectric quartz crystal between said first series resonant circuit capacitance and said second series resonant circuit capacitance.

3. A crystal filter circuit including the combination of, a piezoelectric quartz crystal having a desired series resonant frequency, a signal input circuit, a signal output circuit, a first capacitance connected between one side of said piezoelectric quartz crystal and said signal input circuit, a second capacitance coupling the other side of said piezoelectric quartz crystal to said signal output circuit, a first inductance coupled between said signal input circuit and a reference potential, a second inductance connected between said signal output circuit and said reference potential, said first capacitance and said first inductance being adapted to provide a series resonant circuit which is resonant at the desired series resonant frequency of said piezoelectric quartz crystal, and said second capacitance and said second inductance also being adapted to provide a series resonant circuit having a series resonant frequency equal to the desired series resonant frequency of said piezoelectric quartz crystal.

References Cited in the file of this patent

UNITED STATES PATENTS 1,976,481 Castner ---------------- Oct. 9, 1934
2,330,499 Lehfeldt -------------- Sept. 28, 1943
2,461,956 Beckwith -------------- Feb. 15, 1949

FOREIGN PATENTS 829,429 France ---------------- Mar. 28, 1938
51,477 France ---------------- May 11, 1942
(Addition to Patent 829,429)